United States Patent
Schubert et al.

(10) Patent No.: US 9,105,320 B2
(45) Date of Patent: Aug. 11, 2015

(54) MEMORY DEVICES AND METHODS OF OPERATING THE SAME

(71) Applicant: Micron Technology, Inc., Boise, ID (US)

(72) Inventors: Martin F. Schubert, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 14/055,643

(22) Filed: Oct. 16, 2013

(65) Prior Publication Data

US 2015/0103613 A1    Apr. 16, 2015

(51) Int. Cl.
*G11C 8/02* (2006.01)
*G11C 8/12* (2006.01)

(52) U.S. Cl.
CPC ...................................... *G11C 8/12* (2013.01)

(58) Field of Classification Search
CPC . G11C 17/12; G11C 13/0069; G11C 13/0004
USPC .......................................... 365/231, 148, 163
See application file for complete search history.

(56) References Cited

U.S. PATENT DOCUMENTS

| 7,943,515 | B2 | 5/2011 | Scheuerlein |
| 7,989,789 | B2 | 8/2011 | Toda |
| 8,173,987 | B2 | 5/2012 | Lung |
| 8,654,560 | B2 * | 2/2014 | Deweerd et al. ............... 365/148 |
| 2010/0270529 | A1 | 10/2010 | Lung |
| 2011/0147690 | A1 | 6/2011 | Yang |
| 2013/0153846 | A1 * | 6/2013 | Chien et al. ........................ 257/2 |

OTHER PUBLICATIONS

Related U.S. Appl. No. 13/600,777, entitled, "Three Dimensional Memory Array Architecture," filed Aug. 31, 2012, 68 pages.
Related U.S. Appl. No. 13/600,699, entitled, "Three Dimensional Memory Array Architecture," filed Aug. 31, 2012, 55 pages.

* cited by examiner

*Primary Examiner* — Huan Hoang
(74) *Attorney, Agent, or Firm* — Brooks, Cameron & Huebsch, PLLC

(57) ABSTRACT

The present disclosure includes memory devices and methods of operating the same. One such device includes an array of groups of memory cells, a group selector configured to select a particular group of memory cells from within the array, and a cell selector configured to select a particular memory cell from within the selected particular group of memory cells.

25 Claims, 7 Drawing Sheets

| LAYOUT | SEL SEL | A | | B | | C | | D | | E | |
|---|---|---|---|---|---|---|---|---|---|---|---|
| | | SEL | DESEL | SEL | DESEL | SEL | DESEL | SEL | DESEL | SEL | DESEL |
| 1 | 1 | 15 | 999 | 0 | 0 | 15984 | 0 | 0 | 14985 | 0 | 15968016 |
| 2 | 1 | 15 | 0 | 999 | 0 | 14985 | 0 | 0 | 15984 | 0 | 15968016 |
| 3 | 1 | 15999 | 0 | 0 | 0 | 0 | 999 | 0 | 0 | 0 | 15983001 |
| 4 | 1 | 15 | 0 | 0 | 0 | 15984 | 999 | 0 | 15984 | 0 | 15967017 |
| PRIOR ART | 1 | 999 | 999 | 0 | 0 | 0 | 0 | 0 | 998001 | 0 | 0 |

MEMORY DEVICES AND METHODS OF OPERATING THE SAME

TECHNICAL FIELD

The present disclosure relates generally to memory devices and methods, and more particularly, semiconductor memory devices and methods of operating the same.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, phase change random access memory (PCRAM), spin torque transfer random access memory (STTRAM), resistive random access memory (RRAM), magnetoresistive random access memory (MRAM; also referred to as magnetic random access memory), conductive-bridging random access memory (CBRAM), among others.

Some types of memory devices can be non-volatile memory and can be used for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a smartphone, a tablet, a portable music player, e.g., MP3 player, a movie player, and other electronic devices, among others. Program code and system data, such as a basic input/output system (BIOS), are typically stored in non-volatile memory devices.

Many memory devices, such as RRAM, PCRAM, MRAM, STTRAM and CBRAM, for example, can include arrays of memory cells organized in a two-terminal cross-point architecture, for instance. Arrays of memory cells in a two-terminal cross-point architecture can include electrodes that have planar surfaces between the memory cell material. For filamentary-type memory devices, e.g., RRAM and/or CBRAM, the location of the active region of the memory cell between planar surfaces of the electrodes can be variable because the planar surfaces of the electrodes provide a substantially uniform electric field across the memory cell material.

DETAILED DESCRIPTION

Figure 1:
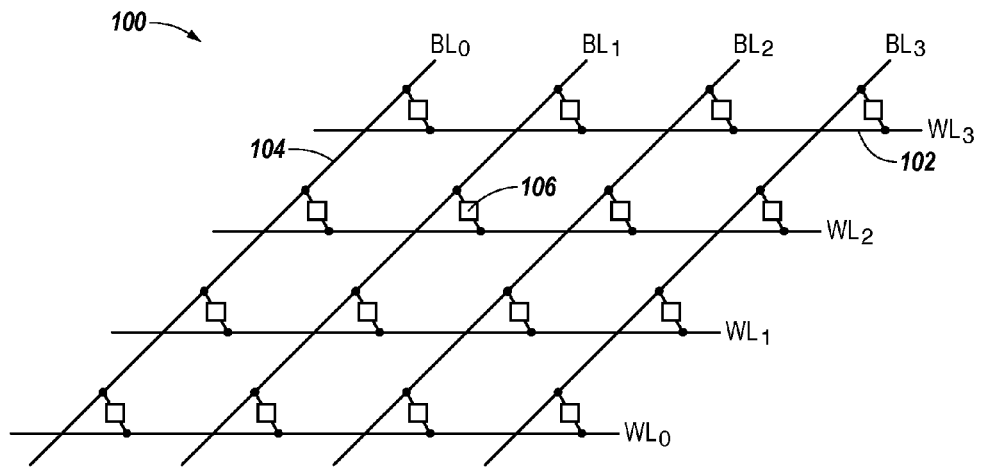
FIG. 1 illustrates a prior art two dimensional memory array.

The present disclosure includes memory devices and methods of operating the same. In a number of embodiments, one such device includes an array of groups of memory cells, a group selector configured to select a particular group of memory cells from within the array, and a cell selector configured to select a particular memory cell from within the selected particular group of memory cells.

In a number of embodiments, a method for operating a device can include applying a first bias to a group selector to activate the group selector, selecting a first group of memory cells from within an array of memory cells using the group selector, and applying a second bias between a data line and a source line to select a particular memory cell from within the selected first group of memory cells.

Memory devices and arrays in accordance with the present disclosure can reduce program-type disturbance, read issues, e.g., parasitic current paths swamping what is being read, and power consumption, e.g., reducing current flowing along paths that do not flow into read circuitry but still consume power. Prior approaches, including cross-point approaches, may involve large numbers of cells that drain a memory cell array, but memory devices, arrays, and methods of operating the devices in accordance with the present disclosure can reduce the number of cells draining the array. For example, in cross-point architectures, the number of memory cells draining an array may include up to all of the memory cells on a word line or bit line contributing to leakage. In contrast, memory devices and arrays in accordance with the present disclosure are limited to memory cells in a group, e.g., pillar, reducing the number of memory cells contributing to leakage, for example.

Embodiments of the present disclosure can provide for a high-density memory array, e.g., high density RRAM memory array, that reduces select device requirements, including, for example, allowing RRAM selected cells to be turned on while suppressing all other non-selected RRAM cells. Current leakage and power consumption can be reduced, and cell reads can be improved. For instance, the need to suppress leakage of a large number of RRAM memory cells, e.g., partially-selected RRAM memory cells, may be reduced.

As used herein, "a number of" something can refer to one or more such things. For example, a number of memory devices can refer to one or more memory devices. Additionally, the designators "N", "M", "P", and "R" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 illustrates a prior art two dimensional memory array 100. The memory array 100 can include a plurality of conductive lines 102, e.g., access lines, which may be referred to herein as word lines, and a number of conductive lines 104, e.g., data lines, which may be referred to herein as bit lines. The word lines 102 are arranged substantially parallel one another at one level, and the bit lines 104 are arranged substantially parallel one another at a different level. In a number of embodiments, substantially parallel can comprise, for example, a little more than parallel or a little less than parallel, but within a threshold. For example, a substantially parallel direction can comprise a direction that is closer to parallel than perpendicular.

The word lines 102 and bit lines 104 are further arranged substantially perpendicular, e.g., orthogonal, to one another.

In a number of embodiments, substantially perpendicular can comprise, for example, a little more than perpendicular or a little less than perpendicular, but within a threshold. For example, a substantially perpendicular direction can comprise a direction that is closer to perpendicular than parallel. The indices shown for each word line 102 and bit line 104 indicate the ordering of the respective lines within a particular level.

In such architectures, the memory cells 106 can be arranged in a matrix of rows and columns. The memory cells 106 can be located at the crossings of the word lines 102 and the bit lines 104. That is, the memory cells 106 are arranged in a cross point architecture. The memory cells 106 are located where word lines 102 and the bit lines 104 pass near one another, e.g., cross, overlap, etc. The word lines 102 and the bit lines 104 do not physically intersect one another since the word lines 102 and the bit lines 104 are formed at different levels.

Figure 2:
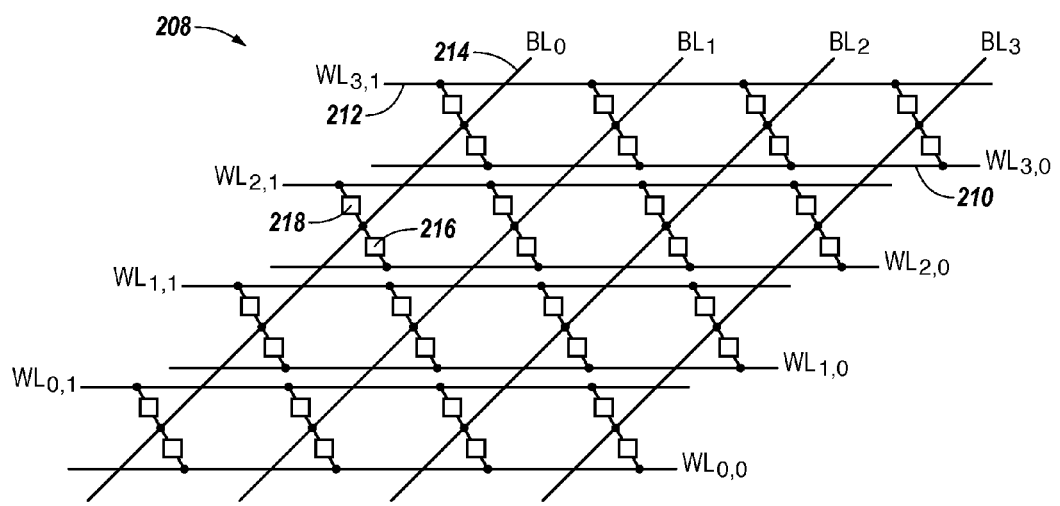
FIG. 2 illustrates a prior art three dimensional memory array.

FIG. 2 illustrates a prior art three dimensional memory array 208. The memory array 208 includes a plurality of word lines 210, 212, and a number of bit lines 214. Word lines 210 are arranged substantially parallel one another at one level and word lines 212 are arranged substantially parallel one another at a different level. As shown in FIG. 2, bit lines 214 are arranged substantially parallel one another at a level different than either of the levels at which word lines 210 and 212 are located, e.g., between the levels at which word lines 210 and 212 are located. The bit lines 214 are further arranged substantially perpendicular, e.g., orthogonal, to word lines 210, 212.

Memory cells 216, 218 are shown in FIG. 2 arranged in a cross point architecture at the crossings of the word lines 210, 212 and the bit lines 214. Memory cells 216 are arranged between word lines 210 and bit lines 214, and memory cells 218 are arranged between word lines 212 and bit lines 214. As such, the memory cells are arranged in multiple levels, each level having memory cells organized in a cross point architecture. The levels are formed at different levels from one another, thereby being vertically stacked. Memory cells are formed at levels between levels at which word lines 212 and bit lines 214 are formed. The three dimensional memory array 208 shown in FIG. 2 includes memory cells 216, 218 having a common a bit line 214, but separate word lines 210, 212. More generally, a three dimensional memory array may have more stacked levels than shown in FIG. 2.

The indices shown for each word line 210, 212 indicate the level and the ordering of the word lines within a particular level. For example, word line 210 ($WL_{3,0}$) is shown being located at position 3 within level 0, and word line 212 ($WL_{3,1}$) is shown being located at position 3 within level 1. As such, memory cell 216 is shown in FIG. 2 being located between bit line 214, e.g., $BL_0$, and the word line below bit line 214, e.g., $WL_{2,0}$, and memory cell 218 is shown in FIG. 2 being located between bit line 214, e.g., $BL_0$, and the word line above bit line 214, e.g., $WL_{2,1}$.

Figure 3:
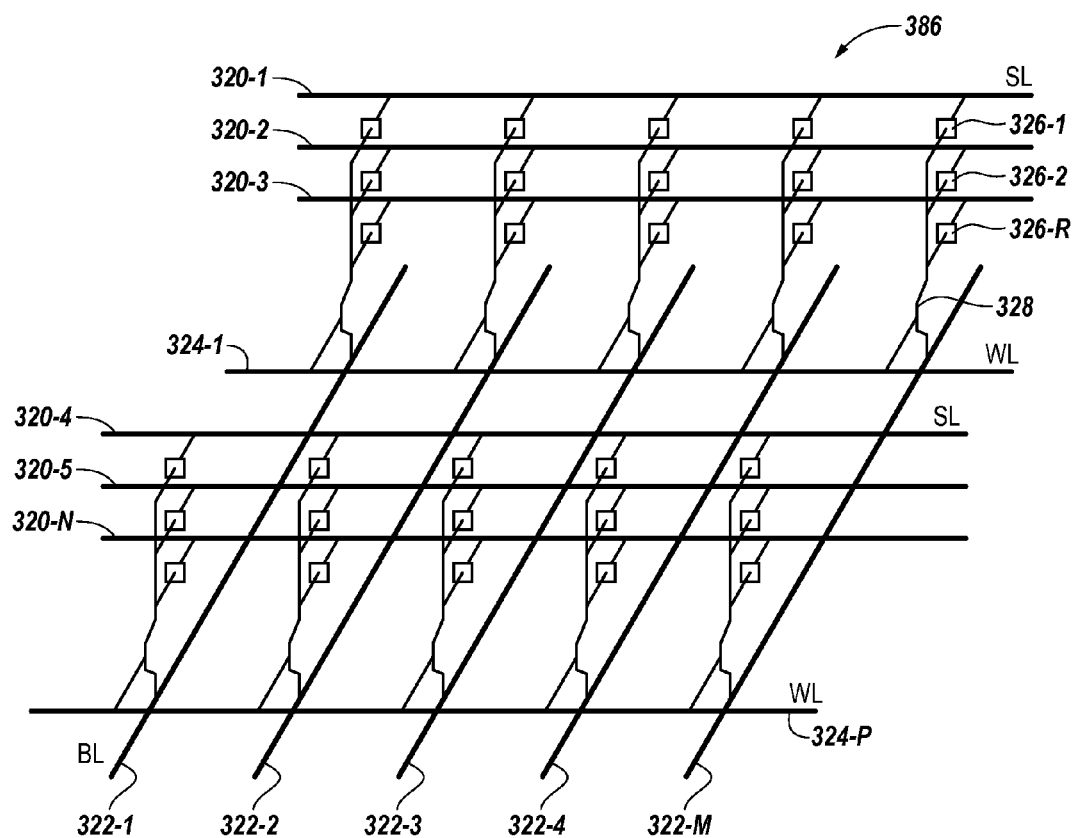
FIG. 3 is a block diagram illustrating a portion of an array of memory cells in accordance with a number of embodiments of the present disclosure.

FIG. 3 is a block diagram illustrating a portion 386 of an array of memory cells in accordance with a number of embodiments of the present disclosure. Portion 386 can comprise, for instance, a two-dimensional or three-dimensional array of groups of cells, wherein each group consists of a stack, e.g., a vertical stack, of memory elements, e.g., RRAM elements.

In the embodiment illustrated in FIG. 3, the portion 386 of the memory array includes a number of memory cells, e.g., RRAM memory cells 326-1, . . . , 326-R, each having an associated access device, referred to herein after as a cell selector, and resistance variable element, e.g., a RRAM material. The cell selectors can be operated, e.g., turned on/off, to select the memory cells in order to perform operations such as data programming and/or data reading operations on the resistance variable elements. For example, each group of cells 326-1, . . . , 326-R, which can also be referred to as a pillar, can have its own dedicated group selector, e.g., group selector 328. The group selector can be turned on via bit lines 322-1, . . . , 322-M and word lines 324-1, . . . , 324-P, and individual cells can be selected from the pillar of cells via source lines 320-1, . . . , 320-P, for example, by a cell selector.

Portion 386 can comprise a device including a variable resistive material, such as a transition metal oxide, that has varying resistance depending on voltages applied thereto. For example, when a voltage equal to or greater than a set voltage is applied to the variable resistive material, the resistance of the variable resistive material decreases (e.g., ON state). When a voltage equal to or greater than a reset voltage is applied to the variable resistive material, the resistance of the variable resistive material increases (e.g., OFF state).

In the embodiment illustrated in FIG. 3, the memory cells 326-1, . . . , 326-R are in series with access device 328, e.g., a three-terminal access device, hereinafter referred to as a group selector. As shown in FIG. 3, a portion, e.g., gate, drain, of each group selector 328 associated with each memory cell may be coupled, e.g., communicatively coupled, to one of a number of word lines 324-1, . . . 324-P, bit lines 322-1, . . . , 322-M, and/or source lines 320-1, . . . , 320-N. For example, each conductive line can be coupled to a group, e.g., pillar, column, of memory cells, e.g., RRAM memory cells. In a number of embodiments, a first terminal of the group selector is coupled to a word line, a second terminal is coupled to a bit line, and a third terminal is coupled to a group of memory cells, e.g., cells may be between the third terminal and a source line.

A memory cell, e.g., cells 326-1, . . . , 326-R, can comprise a memory element material, e.g., storage element material, and an access device, e.g., a cell selector. For example, the cell selector can be in series with the memory element material. The cell selector can comprise, for instance, a two terminal device such as a diode, an ovonic threshold switch (OTS), and/or a non-ohmic device (NOD). The cell selector can include a single device and/or a number of stacked devices, for example.

The cell selector material can include, for example, a chalcogenide material that is responsive to an applied voltage across the cell selector. For an applied voltage that is less than a threshold voltage, the cell selector remains in an "off" state, e.g., an electrically nonconductive state. Alternatively, responsive to an applied voltage across the cell selector that is greater than the threshold voltage, the cell selector enters an "on" state, e.g., an electrically conductive state. Responsive to an applied voltage near a threshold voltage, the voltage across the cell selector may return, e.g., "snapback", to a holding voltage.

In a number of embodiments, the memory element material can comprise one or more of the same material(s) as the cell selector material. However, embodiments are not so limited. For example, the memory element material and the cell selector material can comprise different materials.

The memory element material can be a resistance variable storage material, such that the memory element is a resistance variable storage element. The resistance variable storage element may include a phase change material (PCM), for instance, among other resistance variable storage element materials. In embodiments in which the resistance variable storage element comprises a PCM, the phase change material can be a chalcogenide alloy such as an indium(In)-antimony (Sb)-tellurium(Te) (IST) material, e.g., $In_2Sb_2Te_5$, $In_1Sb_2Te_4$, $In_1Sb_4Te_7$, etc., or a germanium(Ge)-antimony(Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals, e.g., transition metals, alkaline earth metals, and/or rare earth metals. Embodiments are not limited to a particular resistive variable material or materials associated with the memory elements of the memory cells. For instance, other examples of resistive variable materials that can be used to form storage elements include binary metal oxide materials, colossal magnetoresistive materials, and/or various polymer based resistance variable materials, among others.

Subsets of cells coupled to a selected word line, e.g., 324-1, . . . , 324-P, can be programmed and/or sensed, e.g., read, together, e.g., at the same time. A program operation, e.g., a write operation, can include applying at least one program pulse to a selected word line in order to change the resistance of selected cells coupled to that selected access line to a desired level corresponding to a target, e.g., desired, data state.

A sensing, e.g., read, operation can be used to determine the logic state of a memory cell. For instance, particular voltages can be applied to a bit line and word line corresponding to a selected memory cell, and current through the cell responsive to a resulting voltage difference can be sensed. Sensing operations can also include biasing unselected word lines and bit lines, e.g., word lines and bit lines coupled to non-selected cells, at particular voltages in order to sense the logic state of a selected cell.

As an example, an array can be operated in accordance with a half-select method, e.g., a half-selected biasing scheme. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while biasing unselected word lines and bit lines at a reference potential, e.g., a ground potential. As such, a full select voltage (V) is applied across the selected memory cell. In this example, the unselected memory cells coupled to the selected bit line and selected word line experience a half select voltage of +/−V/2 and can be referred to as "half selected" cells. The select devices can allow current through selected memory cells, e.g., cells experiencing the full select voltage (V), while blocking or limiting current through unselected cells coupled to a selected word line and bit line, e.g., cells experiencing the half select voltage. In this example, unselected memory cells coupled to unselected bit lines and/or word lines are unbiased, e.g., they experience a ground potential of 0V, in this example. The select voltage (V) can be a write voltage or a read voltage, for instance. Embodiments of the present disclosure are not limited to a half select method associated with programming or reading cells of an array. For instance, a memory cell array can be operated in accordance with other biasing schemes, e.g., partial biasing schemes, such as a one third select method, among other biasing schemes.

In operation, appropriate voltage and/or current signals, e.g., pulses, can be applied to the bit lines 322-1, . . . , 322-M and/or word lines 324-1, . . . , 324-P in order to program data to and/or read data from the memory cells of the array. As an example, the data stored by a memory cell can be determined by turning on group selector 328 and sensing a current passing through the memory element. The current sensed on the bit line associated with the memory cell being read corresponds to a resistance level of the memory element, e.g., resistance variable element, which in turn corresponds to a particular data value, e.g., a binary value such as 1, 0, 001, 111, 1011, etc.

Embodiments of the present disclosure are not limited to the example illustrated in FIG. 3. For example, as one of ordinary skill in the art will appreciate, the group selector associated with a particular memory cell can be a device other than a MOSFET. In some embodiments, the group selector, e.g., group selector 328, can be a two-terminal access device, e.g., a diode, a three-terminal access device, e.g., a bipolar junction transistor (BJT), among other types of access devices. Also, a memory array can have an architecture other than that illustrated in FIG. 3, as will be understood by one of ordinary skill in the art.

The conductive lines can include conductive material, e.g., a metal material. Examples of the conductive material include, but are not limited to, tungsten, copper, titanium, aluminum, and/or combinations thereof, among other conductive materials. The memory cells can be memory cells such as those described in connection with the memory cell array portions of FIGS. 4A-4D.

The memory cells, e.g., cells 326-1, . . . , 326-R can be resistance variable memory cells, e.g., RRAM cells, CBRAM cells, PCRAM cells, and/or STT-RAM cells, among other types of memory cells. Memory cells can include, for example, a memory element, e.g., memory material, and a select element, e.g., a select device, an access device. The select element, e.g., cell selector, can be a diode or a non-ohmic device (NOD), among others. The select element can include, in some examples, select material, a first electrode material, and a second electrode material.

The memory element of memory cell can include a memory portion of the memory cell, e.g., the portion programmable to different data states. For instance, in resistance variable memory cells, a memory element can include the portion of the memory cell having a resistance that is programmable to particular levels corresponding to particular data states responsive to applied programming voltage and/or current pulses, for instance.

The memory element can include a number of memory materials, which collectively comprise a variable resistance storage element material portion of a memory element. For instance, the materials may include at least one of a metal ion source layer, an oxygen gettering, e.g., source, layer, and an active switching layer, such as a solid state electrolyte, a chalcogenide, a transition metal oxide material, or a mixed valence oxide with two or more metals, e.g., transition metals, alkaline earth metals, and/or rare earth metals. Embodiments are not limited to a particular resistance variable material or materials associated with the memory elements of the memory cells. For instance, the resistance variable material can be a chalcogenide formed of various doped or undoped materials. Other examples of resistance variable materials that can be used to form storage elements include binary metal oxide materials, colossal magnetoresistive materials, and/or various polymer based resistance variable materials, among others.

FIGS. 4A-4D are block diagrams illustrating portions of an array of memory cells in accordance with a number of embodiments of the present disclosure. In the example illustrated in FIG. 4A, word lines 424-1, . . . , 424-P are substantially perpendicular to bit lines 422-1, . . . , 422-M. Source lines 420-1, . . . , 420-N are substantially parallel to word lines 424-1, . . . , 424-P and substantially perpendicular to bit lines 422-1, . . . , 422-M. Portion 488 of a memory array can include group selectors 430, 437, 435, 433, 431, 429, 427, 439, 441, and 443, among others. In a number of embodiments, the group selectors comprise three-terminal transistors. The cells within portion 488 can be identified based on the state of each cell's associated group selector, word line, source line, and bit line.

For example, a cell may be classified as a "selected" cell. In the example illustrated in FIG. 4A, cell 432-2 is a selected cell because it is associated with "turned on" group selector 430, "turned on" bit line 422-M, "turned-on" word line 424-P, and "turned on" source line 420-5. As a result, cell 432-2 is fully selected. In other words, to select cell 432-2, group selector 430, bit line 422-M, word line 424-P, and source line 420-5 can be turned on, e.g., selected.

A cell associated with an "on" group selector, "on" word line, "on" bit line, and "off" source line can be classified as an "A" cell, and can be partially-selected, for example. Such example cells include cells 432-1, 432-R, and 434-2. For instance, while cells 432-1 and 432-R share a common pillar (and group selector 430) with selected cell 432-2, their source lines 420-4 and 420-N, respectively, are not selected. As a result, while selected cell 432-2 has a full voltage (V) drop, A cells 432-1 and 432-R have cell drops of V/2. The full voltage drop can be a result, for example, of a +V/2 and −V/2 bias on source line 420-5 and selected bit line 422-M, respectively. In the example illustrated in FIG. 4A, a sense current flowing out of bit line 422-M may be a sum of selected cell 432-2 and A cells 432-1 and 432-R.

As will be discussed further herein with respect to FIG. 4B, partially selected cells including an "off" transistor and an "off" word line and an "on" source line and an "on" bit line can be classified as B cells (not illustrated in FIG. 4A). As will be discussed further herein with respect to FIG. 6, memory devices and memory cell arrays in accordance with the present disclosure can reduce the number of undesirable cells, e.g., A- and B-type cells, in memory arrays as compared to prior approaches. For example, memory devices and memory cell arrays in accordance with the present disclosure can reduce the number of cells that negatively affect power consumption of the cell.

Partially-selected cells that include an "off" group selector, "on" bit line, "off" source line, and "off" word line can be classified as "C" cells. Examples of C cells can include cells 426-1, . . . , 426-R. For instance, source lines 420-1, . . . , 420-3 are off, bit line 422-M is on, group selector 429 is off, and word line 424-1 is off. As a result, cells 426-1, . . . , 426-R are partially-selected, and classified as C cells.

Logically non-selected cells including an "on" group selector and word line and an "off" bit line and source line can be classified as "D" cells. Examples of D cells can include 434-1 and 434-R. For instance, while cells 434-1 and 434-R share a pillar and a group selector 427 with A cell 434-2, their source lines 420-4 and 420-N, respectively, are not on. As a result, cells 434-1 and 434-R are non-selected cells and can be classified as D cells. The cells associated with group selectors 443, 441, and 439 can include a similar layout as the cells associated with group selector 427, for example, with an A cell between two D cells.

Physically non-selected cells including an "off" group selector, word line, bit line, and source line can be classified as "E" cells. Examples of E cells can include 436-1, . . . , 436-R. For instance, source lines 420-1, . . . , 420-3 are off, group selector 431 is off, word line 424-1 is off, and bit line 422-4 is off. Similarly, the cells associated with group selectors 433, 435, and 437 comprise E cells.

In terms of leakage, A cells may experience more leakage than B cells, B cells more than C cells, C cells more than D cells, and D cells more than E cells. As such, it may be desirable to reduce the number of A and B cells, particularly on selected conductive lines. As will be appreciated, in a number of embodiments, the same cell types may not have exactly the same voltage across each of them. For instance, a first A cell may not have the exact same voltage across it as a second A cell, since there may be some voltage drop across a group selector.

Figure 4A:
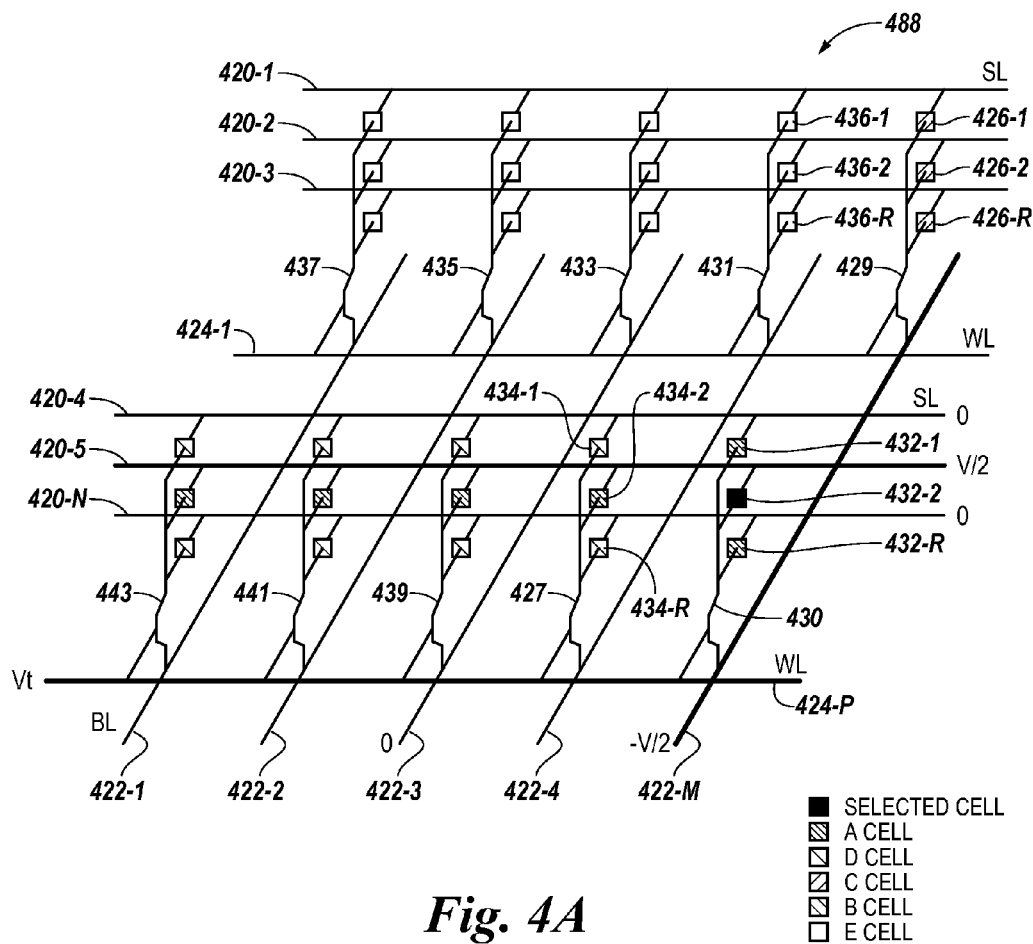
FIGS. 4A-4D are block diagrams illustrating portions of an array of memory cells in accordance with a number of embodiments of the present disclosure.

In the example illustrated in FIG. 4A, one memory cell is selected, e.g., cell 432-2, while the other memory cells are partially selected, e.g., logically unselected, physically unselected. This is similar to a cross-point array; however, memory cell arrays and devices in accordance with the present disclosure have a reduced number of relevant partially-selected cells, e.g., cells 432-1 and 432-R, as opposed to a larger number, e.g., thousands, associated with cross-point memory arrays as compared to cross point arrays. In such examples, the burden on a cell selector to turn off partially selected cells has been reduced, e.g., a suppression factor may be reduced from 1000 to 10.

In a number of embodiments of the present disclosure, the groups of memory cells can share one or more source lines. For instance, instead of each single cell of the group having its own source line, cells can share. Though not illustrated in FIG. 4A, in an example, cell 426-1 may share source line 420-1 with cell 432-1, cell 426-2 may share source line 420-2 with cell 432-2, and cell 426-R may share source line 420-3 with cell 432-R In another example (not illustrated in FIG. 4A), selected cell 432-2 may share selected source line 420-5 with cell 426-2. In such an example, selected source line 420-5 may be coupled, e.g., shorted, with source line 420-2, leaving V/2 across both source lines. In the example, the cell groups may be identical, with the exception of group selector 430 being turned on, while 429 is turned off. As a result, cell 426-2 may change from a C cell to a B cell, with its transistor off, but its source line on.

Sharing source lines may ease integration in a number of embodiments. For example, each row at each line of pillars may not need to be printed; rather, just one wider line may be printed. This may reduce a precision burden, for example. A wider source line may be made thinner while keeping a same cross-section, resulting in a thinner stack. Additionally or alternatively, source planes of an array may be coupled, not just source lines. In a number of embodiments, an entire deck of an array can have coupled source lines/planes, or, alternatively, a smaller number can be coupled, e.g., two or three rows share a source line/plane.

Figure 4B:
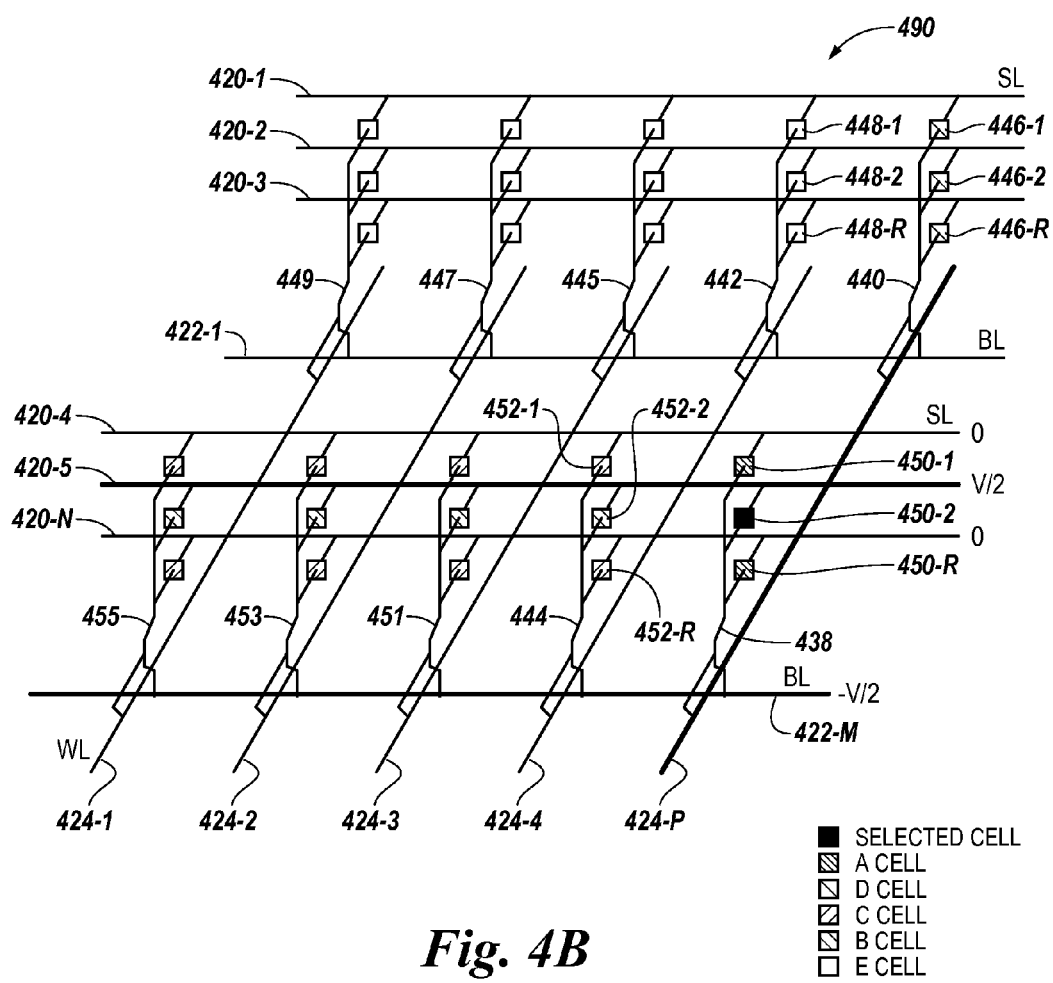

As illustrated in FIG. 4B, portion 490 of a memory array can include word lines 424-1, . . . , 424-P substantially perpendicular to bit lines 422-1, . . . , 422-M and source lines 4201-, . . . , 420-N. Bit lines 422-1, . . . , 422-M and source lines 420-1, . . . , 420-N can be substantially parallel to one another.

In a number of embodiments, bit line 422-M, word line 424-P, group selector 438, and source line 420-5 are in "on" states. In such embodiments, other word lines (and selectors controlled thereby), bit lines, and source lines can be in "off" states. As a result, cell 450-2 is a selected cell, and cells 450-1 and 450-R are A cells. Cells 446-1, . . . , 446-R comprise D cells and cells 448-1, . . . , 448-R associated with group selector 442 comprise E cells. Cells associated with group selectors 445, 447, and 449 can include a similar E cell layout as that of group selector 442, for instance. Cell 452-2 can comprise a B cell, and cells 452-1 and 452-R can comprise C cells. In a number of examples, the cells associated with group selectors 455, 453, and 451 can include a cell layout similar to that of the cells associated with group selector 444.

Figure 4C:
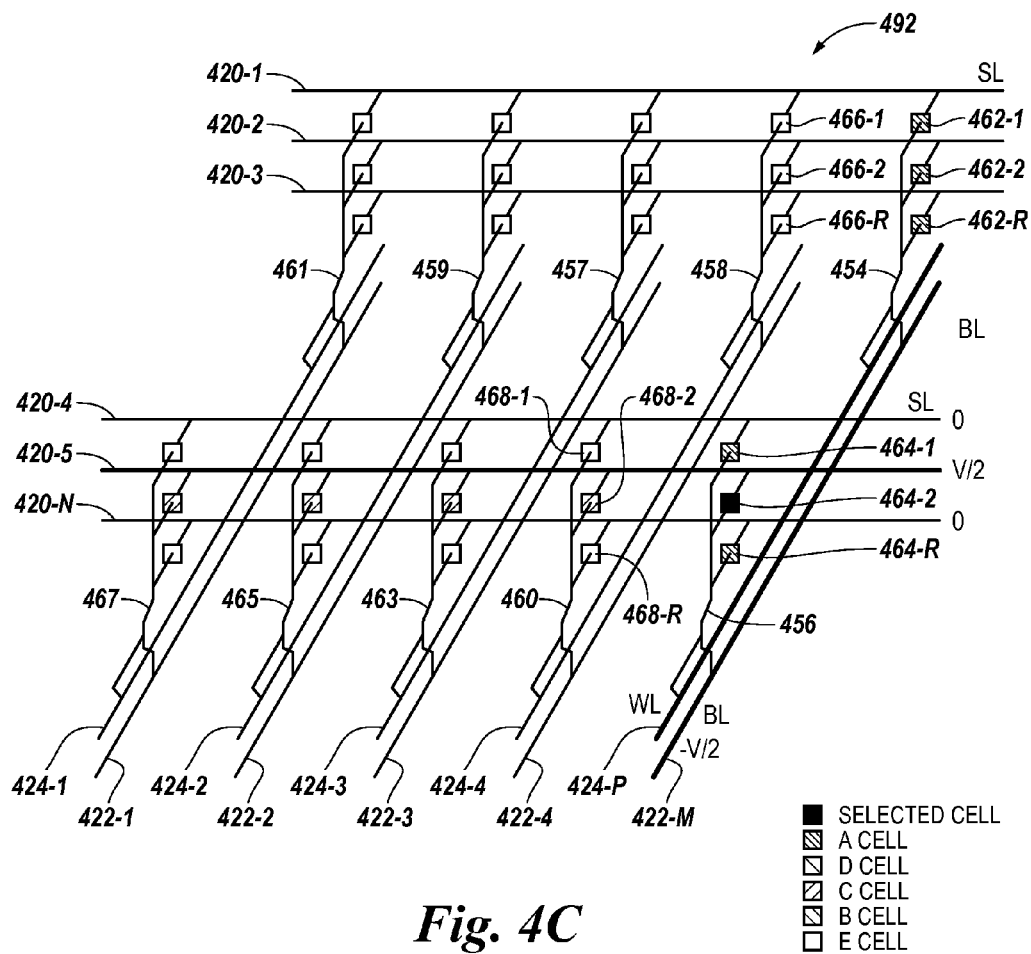

As illustrated in FIG. 4C, portion 492 of a memory array can include word lines 424-1, . . . , 424-P substantially parallel to bit lines 422-1, . . . , 422-M and substantially perpendicular to source lines 420-1, . . . , 420-N. Bit lines 422-1, . . . , 422-M can be substantially perpendicular to source lines 420-1, . . . , 420-N.

In a number of embodiments, bit line 422-M, word line 424-P, group selector 456, and source line 420-5 are in "on" states. In such embodiments, other word lines (and selectors controlled thereby), bit lines, and source lines can be in "off" states. As a result, cell 464-2 is a selected cell, and cells 464-1, 464-R, and 462-1, . . . , 462-R are A cells. Cells 468-1, 468-R, and 466-1, . . . , 466-R comprise E cells and cell 468-2 comprises a C cell. Cells associated with group selectors 457, 459, and 461 can include similar E cell layouts to that of the cells associated with group selector 458. The cells associated with group selectors 463, 465, and 467 can include similar layouts as those cells associated with group selector 460, for example.

Figure 4D:
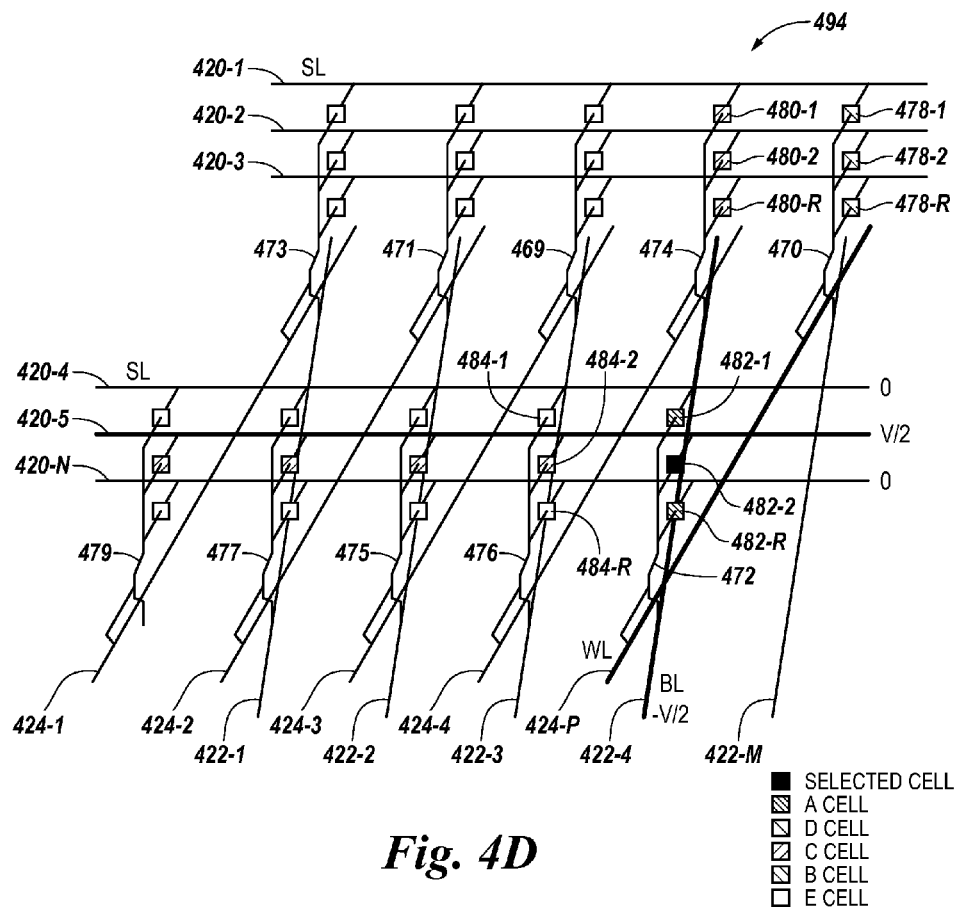

As illustrated in FIG. 4D, portion 494 of a memory array can include word lines 424-1, . . . , 424-P, bit lines 422-1, . . . , 422-M, and source lines 420-1, . . . , 420-N, wherein at least one the word lines, bit lines, and source lines are neither substantially parallel nor substantially perpendicular to one another. In this context, neither parallel nor perpendicular can include the lines running at an angle with respect to the other lines, for example as depicted in FIG. 4D, where bit lines 422 run at an angle with respect to the word lines and source lines. In other embodiments, running at an angle includes the lines, e.g., the bit lines, having a waiving shape, e.g., a zig-zag pattern.

In a number of embodiments, bit line 422-4, word line 424-P, source line 420-5, and group selector 472 are in "on" states. In such embodiments, other word lines (and selectors controlled thereby), bit lines, and source lines can be in "off" states. As a result, cell 482-2 is a selected cell, and cells 482-1 and 482-R are A cells. Cells 478-1, . . . , 478-R associated with group selector 470 comprise D cells, as do cells 484-1 and 484-R. Cells 484-2 and 480-1, . . . , 480-R associated with group selectors 476 and 474, respectively can comprise C cells. In a number of embodiments, the cells associated with group selectors 475, 477, and 479 can include similar layouts to those cells associated with group selector 476. In a number of embodiments, the portion 494 may include a hexagonal architecture, e.g., a hexagonal close-packed pattern (HCP). Such an architecture may increase density of the array.

Figures 5, 6:
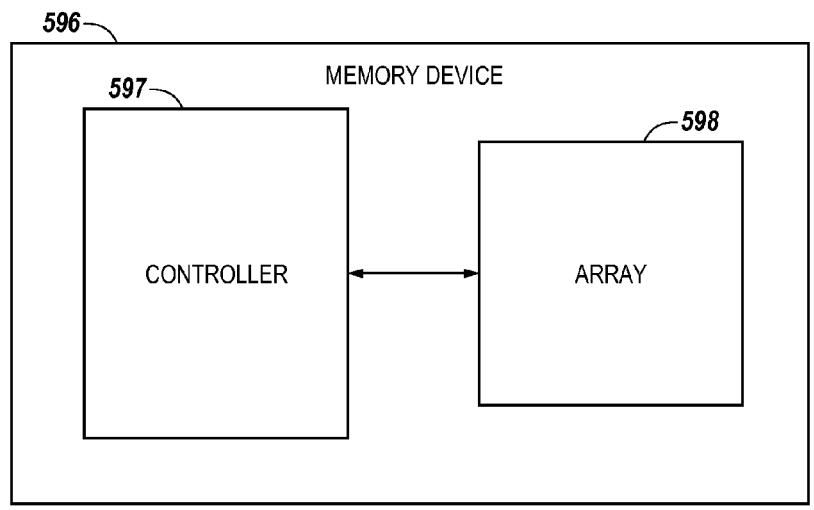
FIG. 5 is an apparatus in the form of a memory device in accordance with a number of embodiments of the present disclosure.
FIG. 6 illustrates a block diagram of an example table of memory cell counts in accordance with a number of embodiments of the present disclosure.

FIG. 5 is an apparatus in the form of a memory device 596 in accordance with a number of embodiments of the present disclosure. Memory device 596 can include an array 598 of resistance variable memory cells according to a number of embodiments of the present disclosure. The array 598 of resistance variable memory cells can be an array including portions of an array such as portion 386 of FIG. 3 and/or portions 488, 490, 492, and 494 in FIGS. 4A-4D. As shown in FIG. 5, memory device 596 includes a controller 597 coupled to memory array 598. As used herein, a memory system, a controller, or a memory device might also be separately considered an "apparatus." An "apparatus" can refer to, but is not limited to, any of a variety of structures or combinations of structures, such as a circuit or circuitry, a die or dice, a module or modules, a device or devices, or a system or systems, for example.

Although one memory array is shown in FIG. 5, embodiments of the present disclosure are not so limited, e.g., memory device 596 can include more than one memory array coupled to controller 597.

Controller 597 can include, for example, control circuitry and/or firmware. Controller 597 can be included on the same physical device, e.g., the same die, as memory array 598, or can be included on a separate physical device that is communicatively coupled to the physical device that includes memory array 598. Controller 597 can be used to control operations. For example, the controller 597 can apply a bias to a group selector to activate the group selector. The controller 597 can select a group of memory cells from within an array of memory cells using the group selector, and can apply a bias between a bit line and a source line to select a particular memory cell from within the selected first group of memory cells. In a number of embodiments, the controller 597 can couple, e.g., short, two source lines together; for instance a first source line being coupled to the selected group of memory cells and the second source line being coupled to a different group of memory cells within the array that are adjacent to the first group of memory cells. In a number of embodiments, at least one memory array can be physically positioned directly above or below the controller, to reduce the areal footprint of the controller-array assembly.

The embodiment illustrated in FIG. 5 can include additional circuitry that is not illustrated so as not to obscure embodiments of the present disclosure. For example, memory device 596 can include address circuitry to latch address signals provided over I/O connectors through I/O circuitry. Address signals can be received and decoded by a row decoder and a column decoder, to access memory array 400.

FIG. 6 illustrates a block diagram of an example table 699 of memory cell counts in accordance with a number of embodiments of the present disclosure. In the example illustrated in FIG. 6, the array is 1000 cells long by 1000 cells wide by 16 cells high, e.g., 1000×1000×16.

In table 699, column 601 includes memory cell array layouts/architectures, and row 603 includes cell types, e.g., selected, A, B, C, D, E. For example, layout 1 may include a layout similar to that of portion 488 of FIG. 4A, layout 2 may correspond to a layout similar to that of portion 490 of FIG. 4B, layout 3 may include a layout similar to that of portion 492 of FIG. 4C, layout 2 may correspond to a layout similar to that of portion 492 of FIG. 4D, and layout "prior art" may correspond to a cross-point memory array layout similar to that of portion 100 and 208 of FIGS. 1 and 2.

As illustrated in row 605, each cell type may include a selected, e.g., "sel", cell, e.g., via a bit line, or a deselected, e.g., "desel", cell. For instance, in the prior art layout, e.g., row 615, 999 A-type cells are on a selected bit line, and 999 A-type cells are on deselected bit lines. This number of A-type cells may increase the burden on cell selectors, and may result in leakage of the cell. In contrast, embodiments in accordance with the present disclosure may reduce the number of A-type and/or B-type cells in an array. In a number of examples, a greater number of selected cells may affect cell reads negatively, and a greater number of deselected cells may affect power consumption negatively.

As illustrated in row 607, layout 1 includes a reduced number of A cells on selected bit lines as compared to the prior art. For example, layout 1 includes 15 A cells and zero B cells on selected bit lines and 999 A cells and zero B cells on deselected bit lines. Similarly, layouts 2 and 4, e.g., rows 609 and 613, include reduced numbers of A-type cells on selected bit lines as compared to the prior art example, e.g., row 613.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A device, comprising:
an array of groups of memory cells;
a group selector configured to select a particular group of memory cells from within the array,
wherein remaining groups of memory cells within the array include partially-selected memory cells and suppressed non-selected memory cells; and
a cell selector configured to select a particular memory cell from within the selected particular group of memory cells.

2. The device of claim 1, wherein the groups of memory cells comprise a stack of memory cells.

3. The device of claim 2, wherein the stack of memory cells comprises a vertical stack of non-volatile memory cells.

4. The device of claim 1, wherein the group selector comprises a three-terminal access device.

5. The device of claim 1 wherein the cell selector comprises a two-terminal access device.

6. The device of claim 5, wherein the two-terminal access device comprises a two-terminal ovonic threshold switch (OTS).

7. The device of claim 1, wherein the array comprises a two-dimensional array.

8. The device of claim 1, wherein the array comprises a three-dimensional array.

9. A device, comprising:
a three-terminal group selector to select a group of memory cells from within an array of memory cells, wherein remaining groups of memory cells within the array include partially-selected memory cells and suppressed non-selected memory cells, and wherein the three-terminal group selector comprises:
a first terminal coupled to a first conductive line;
a second terminal coupled to a second conductive line;
a third terminal is coupled to the group of memory cells; and
a cell selector to select a memory cell from within the group of memory cells.

10. The device of claim 9, wherein the group of memory cells comprises a vertical stack of RRAM elements.

11. The device of claim 9, wherein the first conductive line comprises an access line.

12. The device of claim 9, wherein the second conductive line comprises a data line.

13. The device of claim 9, wherein the three-terminal group selector comprises a transistor.

14. A device, comprising:
an array of groups of memory cells, wherein each group of memory cells comprises a stack of resistance variable materials;
a number of three-terminal group selectors configured to select particular groups of memory cells from within the array,
wherein remaining groups of memory cells within the array include partially-selected memory cells and suppressed non-selected memory cells; and
wherein at least a first memory cell in a first group of the array of groups of memory cells and a second cell in a second group of the array of groups of memory cells share a source line within the array; and
a number of two-terminal select devices configured to select a particular memory cell from within the selected particular group of memory cells.

15. The device of claim 14, wherein the shared source line comprises a shared source plane.

16. An array of memory cells, comprising:
a first group of memory cells selectable by a first group selector;
a memory cell within the first group of memory cells selectable by a first cell selector;
a second group of memory cells selectable by a second group selector and adjacent to the first group of memory cells;
a memory cell within the second group of memory cells selectable by a second cell selector;
wherein the memory cell within the first group of memory cells and the memory cell within the second group of memory cells share a source line of the array of memory cells;
a third group of memory cells within the array comprising partially-selected memory cells; and
a fourth group of memory cells within the array comprising suppressed non-selected memory cells.

17. The array of claim 16, wherein the first group selector comprises:
a first terminal coupled to the first group of memory cells;
a second terminal coupled to a first conductive line of the array; and
a third terminal coupled to a second conductive line of the array.

18. The array of claim 17, wherein the first conductive line comprises an access line, the second conductive line comprises a data line, and the first conductive line is substantially parallel to the second conductive line.

19. The array of claim 17, wherein the first conductive line comprises an access line, the second conductive line comprises a data line, and the first conductive line is substantially perpendicular to the second conductive line.

20. The array of claim 17, wherein the first conductive line comprises an access line, the second conductive line comprises a data line, and the first conductive line is neither parallel nor perpendicular to the second conductive line.

21. The array of claim 17, further comprising a third conductive line coupled to the memory cells of the array, wherein the first conductive line comprises an access line, the second conductive line comprises a data line, and the third conductive line comprises a source line, wherein the third conductive line is perpendicular to at least one of the first conductive line and the second conductive line.

22. The array of claim 16, wherein the first group of memory cells and the second group of memory cells comprise groups of non-volatile memory cells.

23. The array of claim 16, wherein the memory cell within the first group of memory cells is in series with the first cell selector and the memory cell within the second group of memory cells is in series with the second cell selector.

24. The array of claim 16, wherein the first and second cell selectors comprise non-ohmic devices (NOD).

25. A method for operating a device, comprising:
applying a first bias to a group selector in an array of memory cells to activate the group selector;
selecting a first group of memory cells from within the array of memory cells using the group selector;
applying a second bias between a data line and a source line in the array of memory cells to select a particular memory cell from within the selected first group of memory cells;
partially selecting a second group of memory cells from within the array of memory cells; and
suppressing a third, non-selected group of memory cells from within the array of memory cells.

* * * * *